(12) United States Patent
Hsu et al.

(10) Patent No.: US 10,867,803 B2
(45) Date of Patent: Dec. 15, 2020

(54) SEMICONDUCTOR DEVICE AND METHOD

(71) Applicant: Taiwan Semiconductor Manufacturing Company, Ltd., Hsinchu (TW)

(72) Inventors: Yao-Wen Hsu, New Taipei (TW); Jian-Jou Lian, Tainan (TW); Neng-Jye Yang, Hsinchu (TW); Chia-Wei Wu, Miaoli County (TW); Kuan-Lin Chen, New Taipei (TW); Kuo Bin Huang, Jhubei (TW); Li-Min Chen, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/426,431

(22) Filed: May 30, 2019

(65) Prior Publication Data
US 2019/0279876 A1 Sep. 12, 2019

Related U.S. Application Data

(63) Continuation of application No. 15/800,777, filed on Nov. 1, 2017, now Pat. No. 10,312,106.

(60) Provisional application No. 62/539,230, filed on Jul. 31, 2017.

(51) Int. Cl.
| | | |
|---|---|---|
| *H01L 21/02* | (2006.01) | |
| *H01L 21/027* | (2006.01) | |
| *H01L 21/033* | (2006.01) | |
| *H01L 21/311* | (2006.01) | |
| *H01L 21/3213* | (2006.01) | |
| *H01L 21/768* | (2006.01) | |
| *H01L 29/06* | (2006.01) | |

(52) U.S. Cl.
CPC ...... *H01L 21/31111* (2013.01); *H01L 21/027* (2013.01); *H01L 21/0217* (2013.01); *H01L 21/033* (2013.01); *H01L 21/0332* (2013.01); *H01L 21/0335* (2013.01); *H01L 21/0337* (2013.01); *H01L 21/31133* (2013.01); *H01L 21/32134* (2013.01); *H01L 21/76816* (2013.01)

(58) Field of Classification Search
None
See application file for complete search history.

(56) References Cited

U.S. PATENT DOCUMENTS

| 8,597,461 B2 | 12/2013 | Mayer et al. | |
|---|---|---|---|
| 2008/0161217 A1 | 7/2008 | Zhang et al. | |
| 2009/0131295 A1* | 5/2009 | Cui | H01L 21/02063 510/176 |
| 2009/0184092 A1* | 7/2009 | Takahashi | C09K 13/00 216/100 |
| 2014/0202987 A1 | 7/2014 | Nakata et al. | |

(Continued)

FOREIGN PATENT DOCUMENTS

| KR | 20120080595 A | 7/2012 |
|---|---|---|

*Primary Examiner* — Stephanie P Duclair
(74) *Attorney, Agent, or Firm* — Slater Matsil, LLP

(57) ABSTRACT

A method of manufacturing a semiconductor device includes exposing a material to a semi-aqueous etching solution. The semi-aqueous etching solution comprises a solvent which chelates with the material and acts as a catalyst between the etching driving force and the material. As such, the etching driving force may be used to remove the material.

20 Claims, 11 Drawing Sheets

(56) References Cited

U.S. PATENT DOCUMENTS

2016/0083650 A1    3/2016  Sugishima et al.
2017/0107460 A1    4/2017  Liu et al.

\* cited by examiner

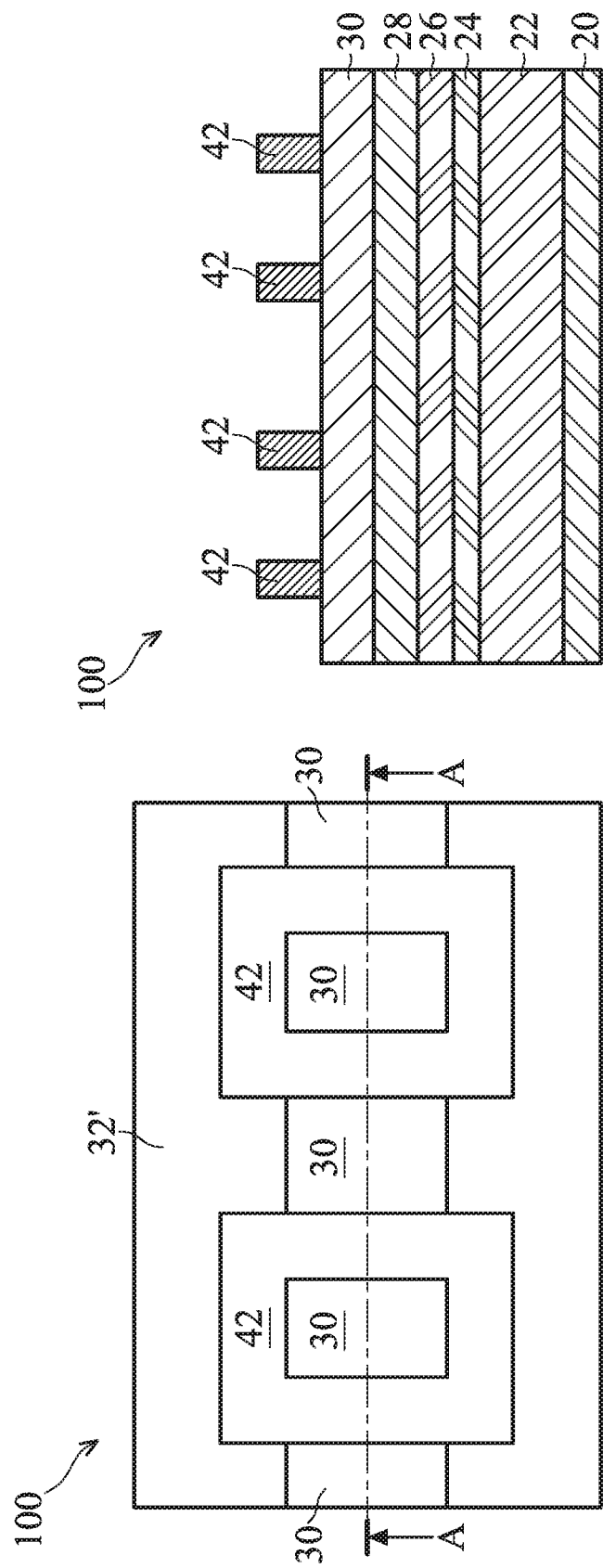

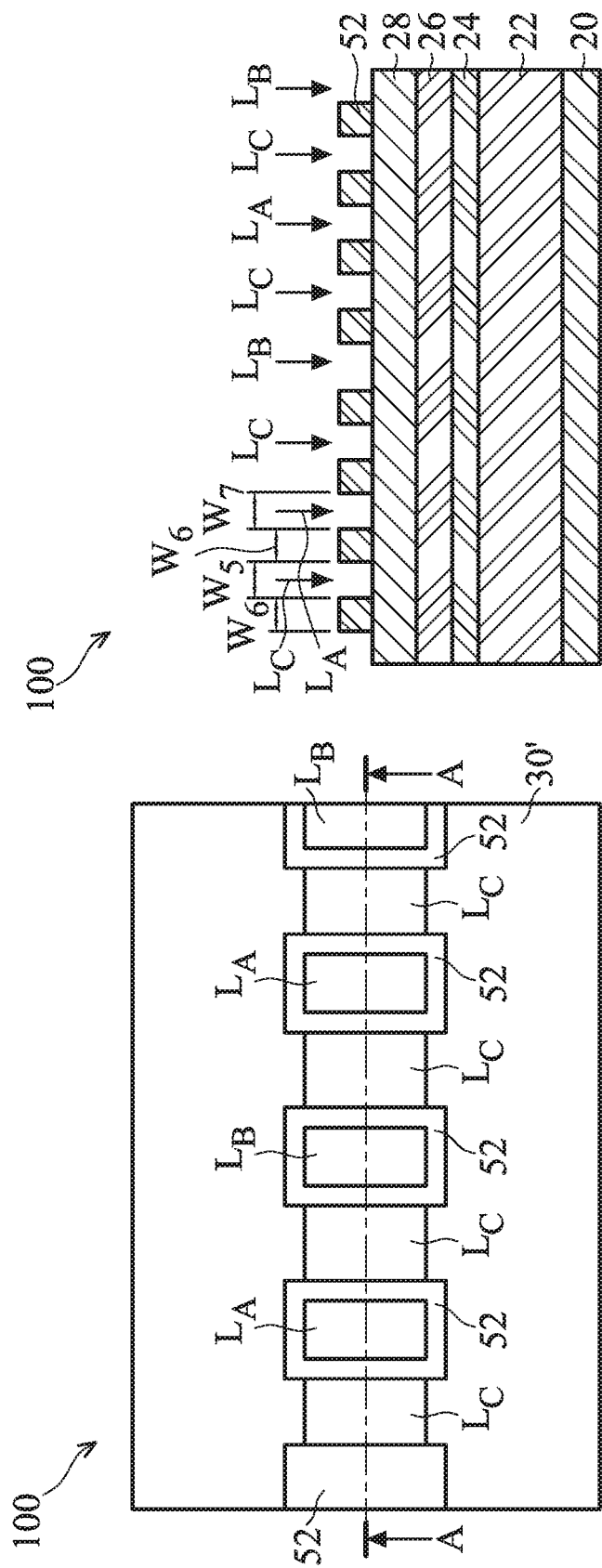

SEMICONDUCTOR DEVICE AND METHOD

PRIORITY CLAIM AND CROSS-REFERENCE

This application is a continuation of U.S. patent application Ser. No. 15/800,777, entitled "Semiconductor Device and Method," filed on Nov. 1, 2017 which claims priority to U.S. Provisional Patent Application No. 62/539,230, entitled "Semiconductor Device and Method," filed on Jul. 31, 2017, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4B illustrate a removal of the mandrels in accordance with some embodiments.

FIG. 8A-8B illustrate a removal of mandrels in accordance with some embodiments.

DETAILED DESCRIPTION

Figures 1A, 1B:
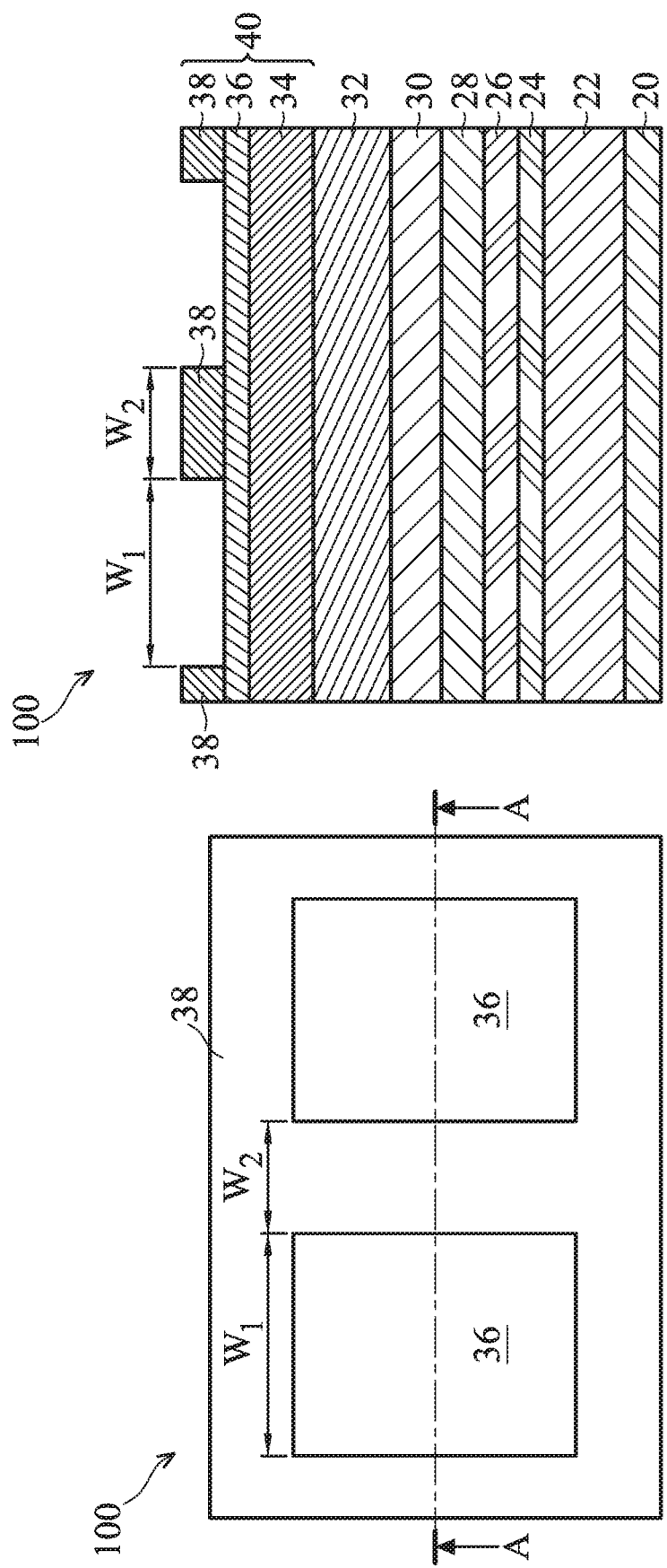
FIGS. 1A-1B illustrate a placement and patterning of a photoresist in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a method for patterning a masking layer that is used to form a semiconductor device layer using a semi-aqueous etching solution. However, the embodiments described below can be used in a wide variety of applications, including semiconductor manufacturing process nodes such as 20 nm, 16 nm, 10 nm, 7 nm, 5 nm, 3 nm, 2 nm or smaller process nodes.

FIGS. 1A through 10 are cross-sectional views of intermediate stages in the patterning of a semiconductor device 100 in accordance with an embodiment. FIGS. 1A and 1B illustrate a top view and a cross-sectional view, respectively, of a semiconductor device 100 at an intermediate stage of processing. FIG. 1B is a cross-sectional view along the line A-A in FIG. 1A. FIGS. 2B through 8B are also cross-sectional views along the same line A-A in each of the respective top view (FIGS. 2A through 8A).

Referring to FIGS. 1A and 1B, the semiconductor device 100 includes an optional etch stop layer (ESL) 20, a semiconductor device layer 22, an anti-reflective coating (ARC) 24, hard mask layers 26, 28, 30, and 32, and a tri-layer photoresist 40 over the hard mask layers 26-32. The semiconductor device layer 22 is a layer that is desired to be patterned. In some embodiments, the semiconductor device layer 22 is a metallic layer to be used for metal lines and is made of copper, aluminum, the like, or a combination thereof. In other embodiments, the semiconductor device layer 22 is a dielectric layer, such as a low-k dielectric layer, a polymer layer, or the like. In yet other embodiments, the semiconductor device layer 22 is a substrate and is made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. In the embodiments wherein the semiconductor device layer 22 is a substrate, the ESL 20 may be omitted. In the embodiments wherein the semiconductor device layer 22 is not a substrate, a substrate (not shown) may be below the optional ESL 20.

The substrate (not shown) may be formed of similar materials as described above, and the description will not be repeated herein.

The substrate (not shown) or in the embodiment wherein the semiconductor device layer 22 is a substrate may include active and passive devices (not shown). As one of ordinary skill in the art will recognize, a wide variety of devices such as transistors, capacitors, resistors, combinations of these, and the like may be used to generate the structural and functional requirements of the design for the semiconductor device 100. The active and passive devices may be formed using any suitable methods.

The ARC 24 may be formed over the semiconductor device layer 22. The ARC 24 prevents radiation in subsequent photolithographic processes from reflecting off layers below and interfering with the exposure process. Such interference can increase the critical dimension of the photolithography process. Sometimes the ARC 24 is referred to as an anti-reflective layer (ARL) 24. In some embodiments, the ARC 24 is a nitrogen-free ARC (NFARC) 24 and is made of a silicon-rich oxide (SRO), silicon oxycarbide, the like, or a combination thereof. In some embodiments, the ARC 24 is formed by chemical vapor deposition (CVD), plasma enhanced CVD (PECVD), the like, or a combination thereof.

The hard mask layers 26, 28, 30, and 32 are formed over the ARC 24. In an embodiment, the hard mask layer 26 is a metal hard mask layer and the hard mask layers 28, 30, and 32 are dielectric hard mask layers. In subsequent processing steps, a pattern is transferred onto the hard mask layer 26 using various photolithography and etching techniques. The hard mask layer 26 may then be used as a patterning mask for etching the underlying ARC 24 and the semiconductor device layer 22. The hard mask layer 26 may be a masking material such as titanium nitride, titanium oxide, the like, or a combination thereof. The hard mask layer 26 may be formed using a process such as CVD, physical vapor deposition (PVD), atomic layer deposition (ALD), the like, or a combination thereof. In an embodiment, the hard mask layer 26 is formed to have a thickness from about 100 Angstroms to about 500 Angstroms.

The hard mask layer 28 may be deposited over the hard mask layer 26. The hard mask layer 28 may be used as a masking pattern for the hard mask layer 26. In subsequent processing steps, the hard mask layer 28 is patterned by multiple patterns (see FIGS. 8A and 8B) which may then be transferred to the hard mask layer 26. The hard mask layer 28 may be a masking material such as tetraethyl orthosilicate (TEOS), $SiO_xC_y$, the like, or a combination thereof. The hard mask layer 28 may be formed using a process such as CVD, ALD, the like, or a combination thereof. In an embodiment, the hard mask layer 28 is formed to have a thickness from about 100 Angstroms to about 1000 Angstroms.

The hard mask layer 30 is formed over the hard mask layer 28. The hard mask layer 30 may be used to form mandrels 30' (see FIG. 5B) and will be referred to as a mandrel layer 30 hereinafter. The mandrel layer 30 may be a masking material such as amorphous silicon, silicon oxide, or silicon nitride, the like, or a combination thereof. The mandrel layer 30 may be formed using a process such as CVD, ALD, the like, or a combination thereof. In an embodiment, the hard mask layer 30 is formed to have a thickness from about 200 Angstroms to about 1000 Angstroms.

The hard mask layer 32 is formed over the mandrel layer 30. The hard mask layer 32 may be used to form mandrels 32' (see FIG. 2B) and will be referred to as a mandrel layer 32 hereinafter. The mandrel layer 32 may be a masking material such as a silicon nitride, silicon oxynitride, the like, or a combination thereof or any other material that may be patterned and selectively removed. The mandrel layer 32 may be formed using a process such as CVD, ALD, the like, or a combination thereof. In an embodiment, the hard mask layer 32 is formed to have a thickness from about 200 Angstroms to about 1000 Angstroms.

The tri-layer photoresist 40 is formed over the mandrel layer 32. The tri-layer photoresist 40 includes a top photoresist layer 38, a middle layer 36, and a bottom layer 34. As the limits of photolithography processes are reached by advanced semiconductor manufacturing processes, the need for thinner top photoresist layers has arisen to achieve smaller process windows. However, thin top photoresist layers may not be sufficiently robust to support the etching of target layers (e.g., the mandrel layer 32). The tri-layer photoresist provides a relatively thin top photoresist layer 38. The middle layer 36 may include anti-reflective materials (e.g., a backside anti-reflective coating (BARC) layer) to aid the exposure and focus of the top photoresist layer 38's processing. By having the middle layer 36, the thin top photoresist layer 38 is only used to pattern the middle layer 36. The bottom layer 34 may include a hard mask material such as a nitride (e.g., SiON). The middle layer 36 is used to pattern the bottom layer 34. In another embodiment the middle layer 36 may comprise the hard mask material while the bottom layer 34 comprises the BARC layer. In some embodiments, the middle layer 36 has a high etch selectivity to the bottom layer 34, and, in some embodiments, the bottom layer 34 is more than ten times thicker than the middle layer 36. Thus, the tri-layer photoresist 40 allows for the robust patterning of underlying layers (e.g., the mandrel layer 32) while still providing a relatively thin top photoresist layer 38.

The top photoresist layer 38 may be patterned using any suitable photolithography technique. For example, a photomask (not shown) may be disposed over the top photoresist layer 38, which may then be exposed to a radiation beam which may be ultraviolet (UV) or an excimer laser such as a 248 nm beam from a Krypton Fluoride (KrF) excimer laser, or a 193 nm beam from an Argon Fluoride (ArF) excimer laser. Exposure of the top photoresist layer 38 may be performed using an immersion lithography system to increase resolution and decrease the minimum achievable pitch. A bake or cure operation may be performed to harden the top photoresist layer 38, and a developer may be used to remove either the exposed or unexposed portions of the top photoresist layer 38 depending on whether a positive or negative resist is used. Thus, a pattern such as the pattern illustrated in FIGS. 1A and 1B is formed in the top photoresist layer 38 including the two openings in the top photoresist layer 38 with each opening having a width $W_1$. The two openings are separated by a width $W_2$. The widths $W_1$, $W_2$, and subsequent widths (see width $W_3$) are described in terms of the desired spacing and/or width of pattern to be applied to the semiconductor device layer 22 (see FIGS. 9A and 9B) which will represented by X. In an embodiment, the width $W_1$ is about 5X and the width $W_2$ is about 3X. In an exemplary embodiment, the desired spacing and width value of X is between about 16 nm and about 20 nm. In this example of X being 16 nm, the resulting pitch would be 32 nm (see FIGS. 8A and 8B), the width $W_1$ (5X) would be about 80 nm, and the width W2 (3X) would be about 48 nm.

FIGS. 1A and 1B illustrate two openings in the photoresist 38, although there may be more or less openings depending on the number of spacers 52 that are desired (see FIG. 8B). In addition, although the width and spacing in FIGS. 8A and 8B are equal, this disclosure contemplates other embodiments wherein the width and spacing of the spacers 52 are not equal.

Figures 2A, 2B:
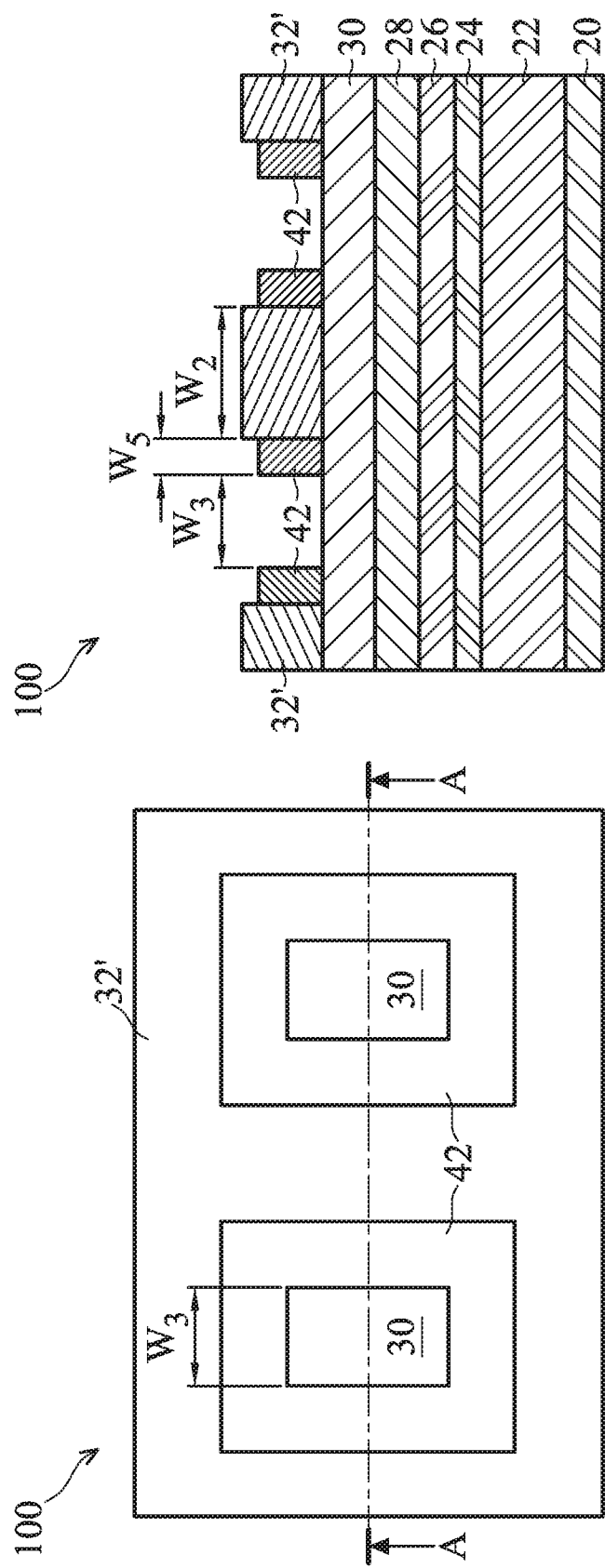
FIGS. 2A-2B illustrate formation of spacers adjacent to mandrels in accordance with some embodiments.

FIGS. 2A and 2B illustrate the resulting structure after the mandrel layer 32 has been patterned forming openings and mandrels 32'. After developing and patterning the top photoresist layer 38, the pattern is transferred to the middle and bottom layers 36 and 34, respectively. The pattern may be transferred, for example, by one or more selective etching processes. After the selective etching processes, the top photoresist layer 38 and the middle layer 36 may be removed by, for example, a trimming process such as an anisotropic plasma etch process. In some embodiments, portions of the bottom layer 34 are also removed during the trimming process to achieve a more stable aspect ratio for subsequent etching steps. In an embodiment, the mandrel layer 32 is etched using the bottom layer 34 as a patterning mask forming the mandrels 32'. In this embodiment, the remaining portions of the bottom layer 34 are removed by, for example, a wet clean process. In another embodiment, the trimming process is omitted, and the mandrel layer 32 is patterned using all three of three layers (38, 36, and 34) of the tri-layer photoresist 40 forming the mandrels 30'. In some embodiments, the mandrel layer 32 is patterned by a dry etch process with etch process gases including $O_2$, $CO_2$, $C_xH_yF_z$, Ar, $N_2$, $H_2$, the like, or a combination thereof. As illustrated in FIGS. 2A and 2B, the mandrels 32' are formed to have the width $W_2$.

After the mandrels 32' are formed, a spacer layer (not shown) is formed over the mandrels 32' and the hard mask layer 30. In an embodiment, the spacer layer is conformally deposited over the mandrels 32' and the hard mask layer 30 such that the thickness of the spacer layer on the top surface of the hard mask layer 30 and the sidewalls of the mandrels 32' is substantially a same thickness. In some embodiments, the spacer layer is a metal-containing spacer layer and is made of, titanium nitride, titanium oxide, aluminum oxide, the like, or a combination thereof. The material of the spacer layer is selected to have a high etch selectivity to the hard mask layer 30 so that subsequent etching steps may be performed on the spacer layer without significantly attacking the hard mask layer 30. The spacer layer may be deposited through a process such as ALD, CVD, PVD, the like, or a combination thereof, although any acceptable process may be utilized to form the spacer layer to a thickness from about 50 Angstroms to about 250 Angstroms. Further, the thickness of the spacer layer may be selected to determine the thickness of features eventually formed in the semiconductor device layer 22.

After the spacer layer is formed over the mandrels 32', the spacer layer may be etched to expose the mandrels 32' and form spacers 42. The top portions of the spacer layer may be anisotropically etched to expose the underlying mandrels 32' and hard mask layer 30 to form the spacers 42. The spacers 42 are formed along the sidewalls of the mandrels 32' in the openings of the mandrel layer. In an embodiment, the etchant used to etch the top portions of the spacer layer is $Cl_2$, $O_2$, $C_xH_yF_z$, $N_2$, $H_2$ the like, a combination thereof, or any suitable etchant that can remove the top surfaces of the spacer layer. In an embodiment, the spacers 42 are formed to have a width $W_5$ of about 1X and the width $W_3$ between adjacent spacers 42 is about 3X or between about 48 nm and about 62.5 nm. In some embodiments, the widths $W_2$ and $W_3$ are substantially equal.

Figures 3A, 3B:
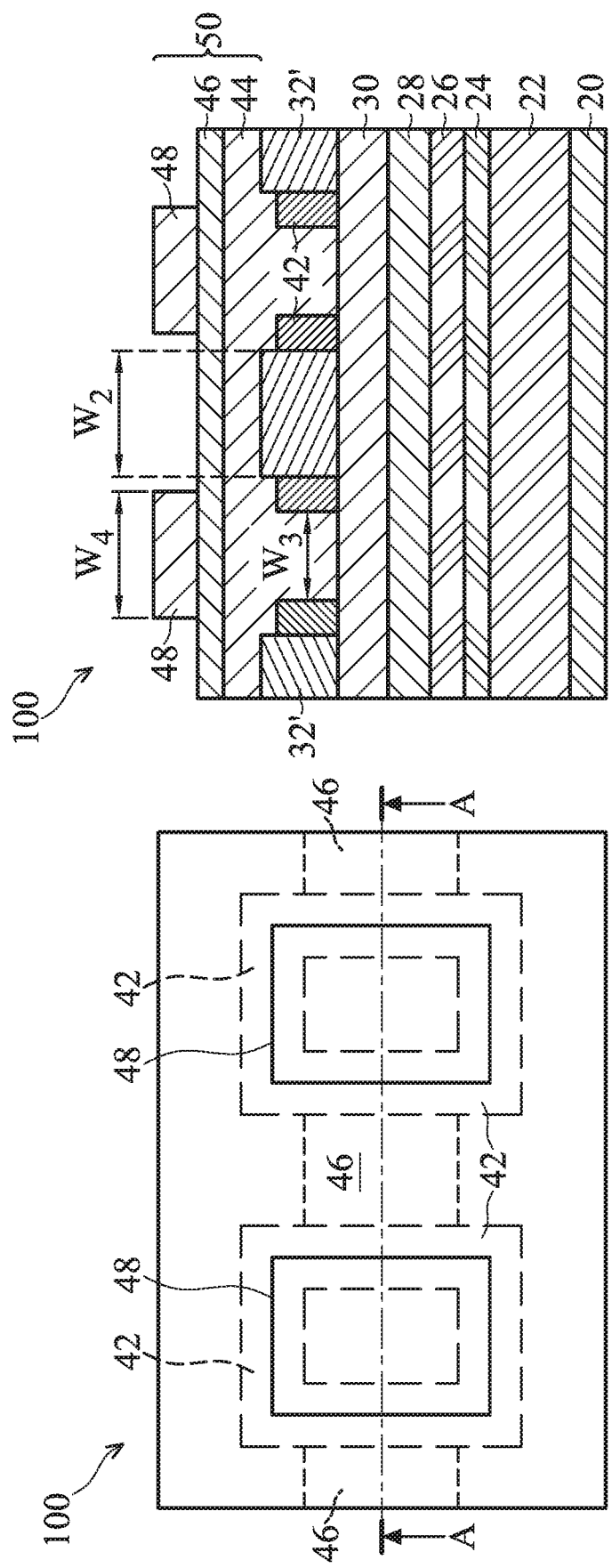
FIGS. 3A-3B illustrate a placement and patterning of another photoresist in accordance with some embodiments.

After the spacers 42 are formed, a tri-layer photoresist 50 is formed over the spacers 42 and the mandrels 32' as illustrated in FIGS. 3A and 3B. The tri-layer photoresist 50 may be substantially similar to tri-layer photoresist 40 and includes a relatively thin top photoresist layer 48, a middle layer 46 (e.g., a BARC), and a bottom layer 44 (e.g., a hard mask material).

The top photoresist layer 48 may be patterned, for example, by using an immersion photolithography system including a radiation beam which may be a 248 nm beam from a KrF excimer laser or a 193 nm beam from an ArF excimer laser to expose portions of top photoresist layer 48 and develop the exposed/unexposed portions depending on whether a positive/negative photoresist is used. Thus, a pattern such as the pattern illustrated in FIGS. 3A and 3B is formed in the top photoresist layer 48 including the three openings in the top photoresist layer 48 with the openings being separated by a portion of top photoresist layer 48 having a width $W_4$. In an embodiment, the width $W_4$ is from about 3X to about 5X, such as about 4X. The pattern of the top photoresist layer 48 will be used to mask the portions of the hard mask layer 30 exposed between spacers 42 so that the mandrels 32' may be removed by a subsequent etching process. Thus, the width $W_4$ should be greater than or equal to the width $W_3$ of the exposed portion of the hard mask layer 30 and the width $W_4$ should be less than the width $W_3$ plus the widths of the spacers 42 surrounding the exposed portion of the hard mask layer 30. In some embodiments, the openings formed in the top photoresist layer 48 also have a width $W_4$. The pattern shown in FIGS. 3A and 3B is for illustrative purposes only and different patterns may be formed depending on the design of semiconductor device 100.

FIGS. 4A and 4B illustrate the removal of the mandrels 32' exposed in the openings of the top photoresist layer 48 (see FIGS. 3A and 3B). The middle layer 46 and the bottom layer 44 of the tri-layer photoresist 50 are patterned by the top photoresist layer 48 such that top surfaces of the mandrels 32' are exposed. In an embodiment, the exposed mandrels 32' are patterned by a dry etch process with etch process gases including $O_2$, $CO_2$, $C_xH_yF_z$, Ar, $N_2$, $H_2$, the like, a combination thereof, or any other suitable etchant that can remove the mandrels 32' without damaging the spacers 42.

Figure 5B:
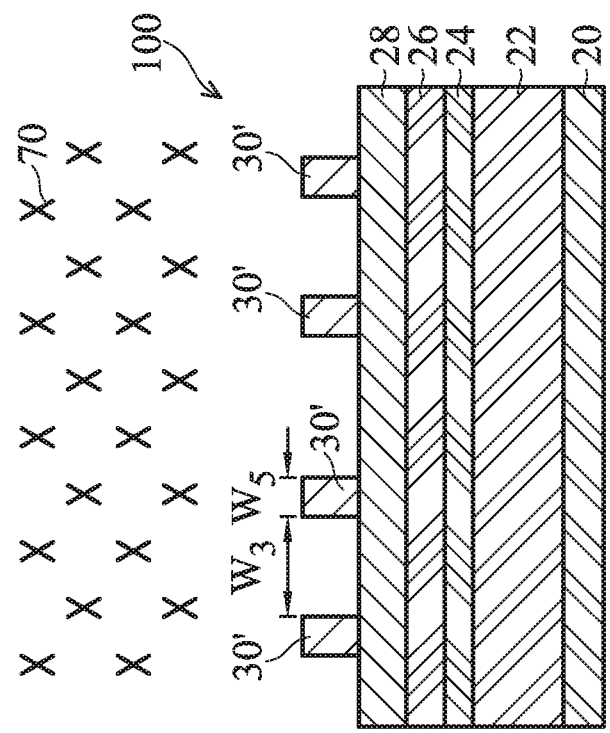
FIGS. 5A-5D illustrate a patterning of mandrels in accordance with some embodiments.
Figure 5A:
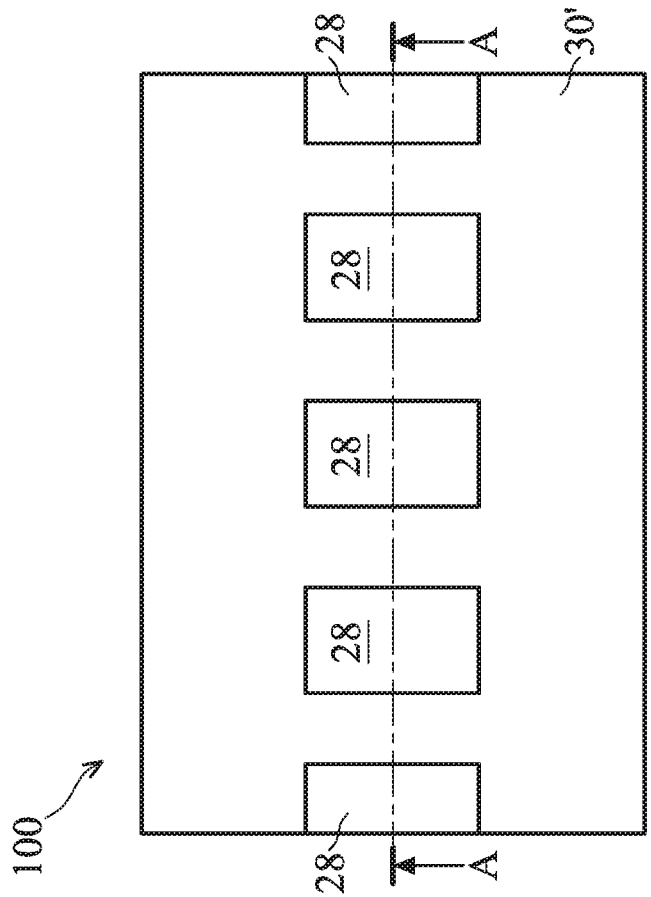

FIGS. 5A and 5B illustrate patterning the hard mask layer 30 with the spacers 42 to form mandrels 30'. In an embodiment the mandrels 30' may be formed using, for example, a wet etching process that uses a semi-aqueous system (which includes water as a component) with a wet etching solution 70 (represented in FIG. 5B by the "X"s labeled 70) that can protect other exposed surfaces, such as surfaces that may comprise an —OH group, such as an embodiment in which the underlying hard mask layer 28 is silicon oxide or other exposed surfaces which may comprise metal oxides, such as titanium oxide or aluminum oxide.

In an embodiment the wet etching solution 70 utilizes a solvent, an etching driving force, a pH control buffer, an inhibitor, a surfactant, and water. The solvent is utilized not only as a mixing and delivery system, but is also a chelator that may be placed within the wet etching solution 70 and is used to help catalyze the reaction between the etching driving force (described further below) and the material of the hard mask layer 30 (e.g., silicon). As such, the solvent is dependent at least in part on the material of the hard mask layer 30 and the etching driving force. However, in an embodiment in which the hard mask layer 30 is amorphous silicon and the etching driving force is a fluorine donor (as described further below), the solvent may comprise an N-ethanolamide derivative ligand. In a particular embodiment the solvent may have the following structure:

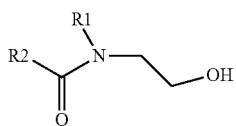

Wherein R1 is an Alkyl, an Ester, or an Organic Cyclic Ring and Wherein R2 is an Alkyl, an Ester, or an Organic Cyclic Ring, or Alternatively, R1 and R2 can Form a Cyclic Ring.

In particular embodiments the solvent may be 1-(2-hydroxyethyl)-2-pyrrolidinone, N,N-diethanololeamide, N-hydroxyethylphthalimide, 1-(2-hydroxyethyl)pyrrolidine-2,5-dione, N-(2-hydroxyethyl)-1,2,3,6-tetrahydrophthalimide, which may respectively have the following structures:

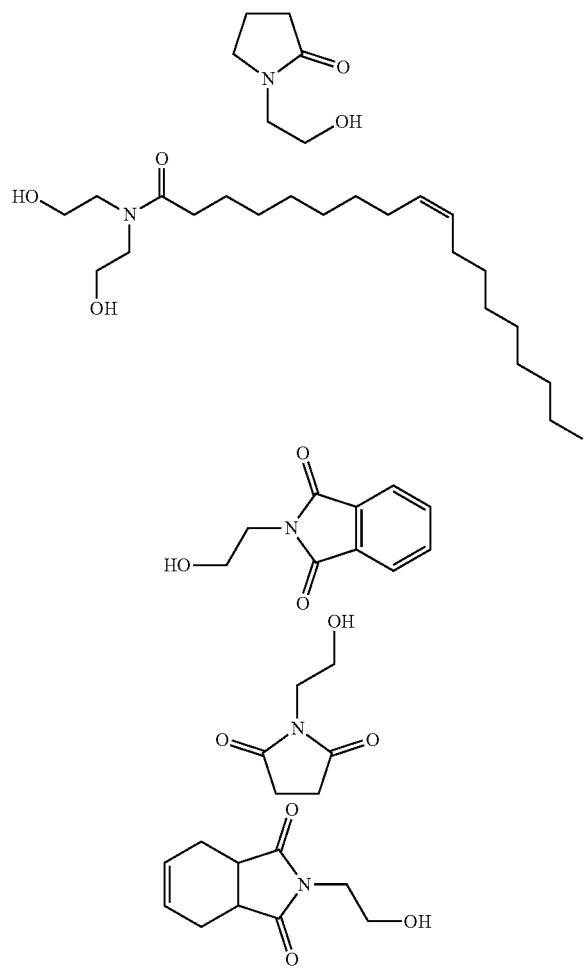

However, while the previously described embodiments of the solvent have been described in detail, these embodiments are intended to be illustrative and are not intended to be limiting. Rather, any suitable material may be utilized as the solvent. All such materials are fully intended to be included within the scope of the embodiments.

In an embodiment the solvent may be present in a concentration sufficient to be a catalyst during the etching process. As such, the solvent may have a concentration of between about 10 wt % and about 70 wt %, such as about 40 wt %. However, any suitable concentration may be utilized.

The etching driving force may be an etchant suitable to react with the material of the hard mask layer 30 (e.g., amorphous silicon) while being catalyzed by the solvent. In a particular embodiment the etching driving force may be a single fluorine donor such as a fluoride salt with a structure such as AF, wherein "A" represents an ammonia, an amine, or a phosphoric group. Such a salt will decompose into A+ and F− during the wet etching process to supply fluorine ions. In an embodiment the single fluorine donor may be present within the wet etching solution 70 at a concentration of between about 0.1 wt % and about 10 wt %, such as about 0.3 wt %.

In another embodiment multiple sources of fluorine ions may be utilized. For example, in addition to the AF single fluorine donor, a second donor of fluorine ions may also be utilized. In a particular embodiment a second donor such as $DHF_2$ may be utilized, wherein "D" may also comprise an ammonia, amine, or phosphoric group. Such a donor will also decompose into D+ and $HF_2$−. In such an embodiment the single fluorine donor (e.g., AF) may be present at a concentration of between about 0.1 wt % and about 5 wt %, such as about 0.2 wt %, while the second donor (e.g., $DHF_2$) may be present at a concentration of between about 0.1 wt % and about 5 wt %, such as about 0.2 wt %.

By utilizing the single donor or the multiple donor embodiments, the removal of the material of the hard mask layer 30 (e.g., amorphous silicon) can be tuned by tuning the pH of the wet etching solution 70. In particular, by tuning the pH, the relative dissociation rates that produce the F− and the $HF_2$− can be altered by modifying the pH of the wet etching solution 70. In a particular embodiment, the pH of the wet etching solution 70 may be kept between about 4.5 and about 5.5, such as about 5.3. However, any suitable pH may be utilized.

In order to control the pH of the wet etching solution 70, the wet etching solution 70 may also comprise a buffer in order to control the pH and inhibit overetching. In an embodiment the buffer may be an amine or alkaline component that may be added in order to modify the overall pH of the wet etching solution 70. In a particular embodiment the buffer may be monoethanolamine (MEA), although any suitable buffer may be utilized. The buffer may be present in the wet etching solution 70 at a concentration of between about 1 wt % and about 5 wt %, such as about 3 wt %. However, any suitable concentration may be utilized.

Optionally, a surfactant may be utilized in order to reduce the surface tension of the wet etching solution 70 and increase the wetting ability of the wet etching solution 70. Additionally, in some embodiments the surfactant may also be used as an oxide inhibitor. In an embodiment the surfactant may be a long chain hydrocarbon with an alcohol group such as a glycol at a concentration of between about 0.1 wt % and about 10 wt %, such as about 0.3 wt %. For example, the surfactant may comprise <0.3 wt %. In specific embodiments the surfactant may be ethylene oxide, propyl oxide, combinations, of these, or the like. However, any suitable surfactant at any suitable concentration may be utilized.

To help mix and deliver the above described components, the components may be placed into water such that the wet etching solution 70 is a semi-aqueous solution. In an embodiment the water will make up the remainder of the wet etch solution 70. As such, the water may have a concentration of between about 30 wt % and about 90 wt %, such as about 70 wt %. However, any suitable concentration may be utilized.

By utilizing the solvent within the wet etching solution 70 in order to catalyze the reaction, there is no need for using oxidants within the wet etching solution 70, and the oxidants may be omitted. Additionally, extreme pHs (such as greater than about 10 or 12 or less than about 4) are also not necessary, allowing the wet etching process to proceed at much milder pHs, such as between about 5 and about 8, and enlarging the process window. Such mild conditions allows for less damage to more fragile materials (e.g., the TEOS formed silicon oxide in the hard mask layer 28, or, in other embodiments, exposed surfaces such as low-k-like, porous materials) which may be damaged by etchants at high pH values (which usually include KOH, TMAH, SC-1 and the like) or which may be damaged by a solution with oxidants (e.g., HF—$H_2O_2$, HF—$NHO_3$, or the like).

Once the wet etching solution 70 has been prepared, the wet etching solution 70 may be placed into physical contact with the mandrel layer 30. In an embodiment the wet etching solution 70 may be placed into contact with the material of the mandrel layer 30 by dipping the structure comprising the mandrel layer 30 into a pool of the wet etching solution 70 in a dip method. However, any other suitable process of contacting the wet etching solution 70 with the mandrel layer 30, such as puddle processes, spray-on processes, combinations of these, or the like, may be utilized.

Additionally, the wet etching process utilizing the wet etching solution 70 may be performed at a temperature of between about 30° C. and about 65° C., such as about 50° C. Further, the wet etching process may be continued until the material of the mandrel layer 30 (e.g., amorphous silicon) is patterned and the hard mask layer 28 is exposed, such as between about 100 nm and about 5 nm, such as about 250 nm. However, any suitable temperature and time may be utilized.

Figure 5C:
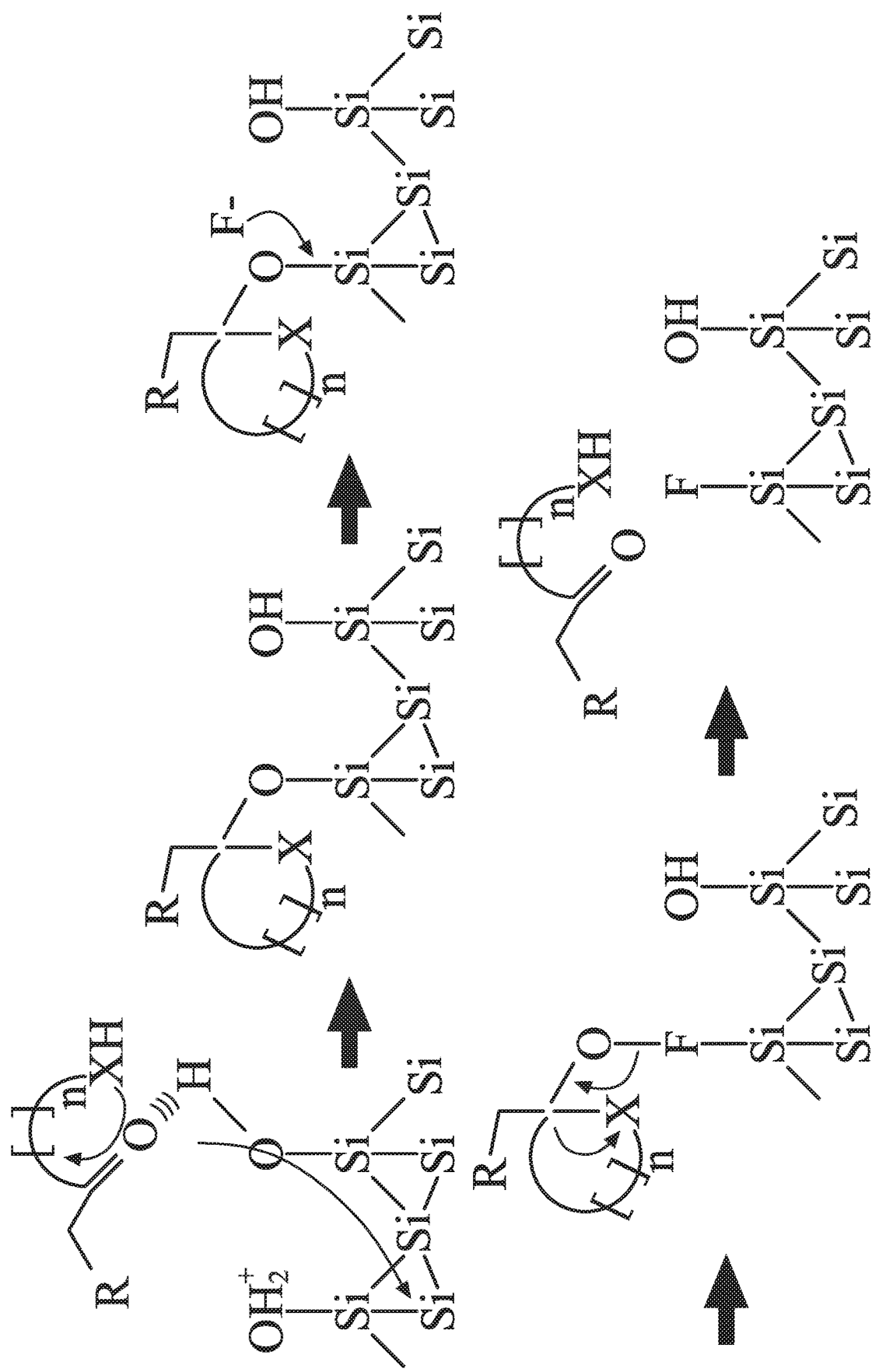

FIG. 5C illustrates one potential reaction mechanism which, without being bound by theory, helps illustrate the etching of the material of the mandrel layer 30 (e.g., amorphous silicon) at a mild pH and without the use of oxidants. In this embodiment the solvent (as described above) may hydrogen bond with an exposed —OH group and then react with an adjacent oxygen atom through intermolecular cyclization. Once bonded, the solvent weakens the Si—O bond such that a fluorine atom (from the disassociation of the etching driving force) will more easily react and attack the silicon-oxygen bond between the silicon and the solvent, cleaving the bond with the solvent and replacing the solvent (which then reforms) and leaving a fluorine atom as the exposed group.

Figure 5D:
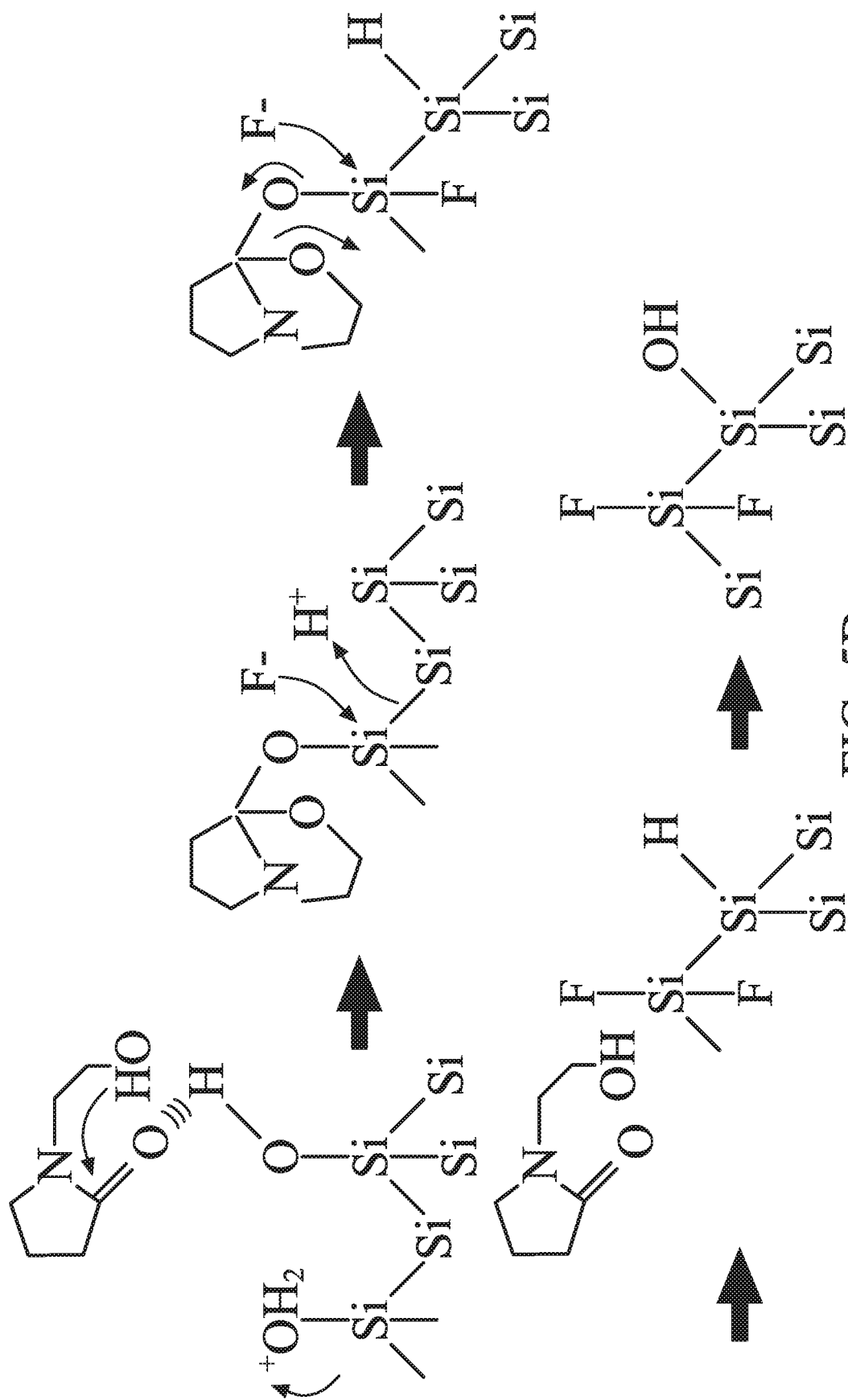

FIG. 5D illustrates another potential reaction mechanism which specifically uses 1-(2-hydroxyethyl)-2-pyrrolidinone as the solvent. In this mechanism, and again not to be bound by theory, the 1-(2-hydroxyethyl)-2-pyrrolidinone will hydrogen bond with an exposed —OH group and then react with an adjacent oxygen atom. Once bonded, a fluorine atom (from the disassociation of the etching driving force) will react, cleaving the bond with the 1-(2-hydroxyethyl)-2-pyrrolidinone and replacing the 1-(2-hydroxyethyl)-2-pyrrolidinone (which then reforms) and leaving a fluorine atom as the exposed group. Additionally, oxygen ions will also inset to the silicon surface to replace the exposed hydrogen, and the oxygen will then hydrolyze to form silicone hydroxide.

Once the fluorine has reacted and becomes present as an exposed group of the material of the mandrel layer 30 (e.g., amorphous silicon), the fluorine will undergo a hydrolysis reaction with the water present in the semi-aqueous wet etching solution 70. The hydrolysis reaction will remove the silicon along with the fluorine, thereby effectuating a removal of silicon from the mandrel layer 30 and actually etching and removing the material of the mandrel layer 30.

However, by using the solvent to help catalyze the reaction, oxidants are not needed within the wet etching solution. Further, extreme pHs are not needed in order to effectuate the removal of the materials. As such, other exposed materials, such as the material of the underlying hard mask layer 28 (e.g., silicon oxide, etc.) are not removed as much as they would be at extreme pHs or with the use of oxidants. As such, critical dimension losses may be kept to a positive loss of less than 4 nm, such as about 3 nm (for an etch at 50° C. for about 240 seconds that results in a width $W_3$ of about 62.5 nm) or about than 34.8 nm (for an etch at 50° C. for about 1200 seconds and an aspect ratio of about 3 (45/15) that results in a width $W_3$ of about 93.3 nm).

Figures 6A, 6B:
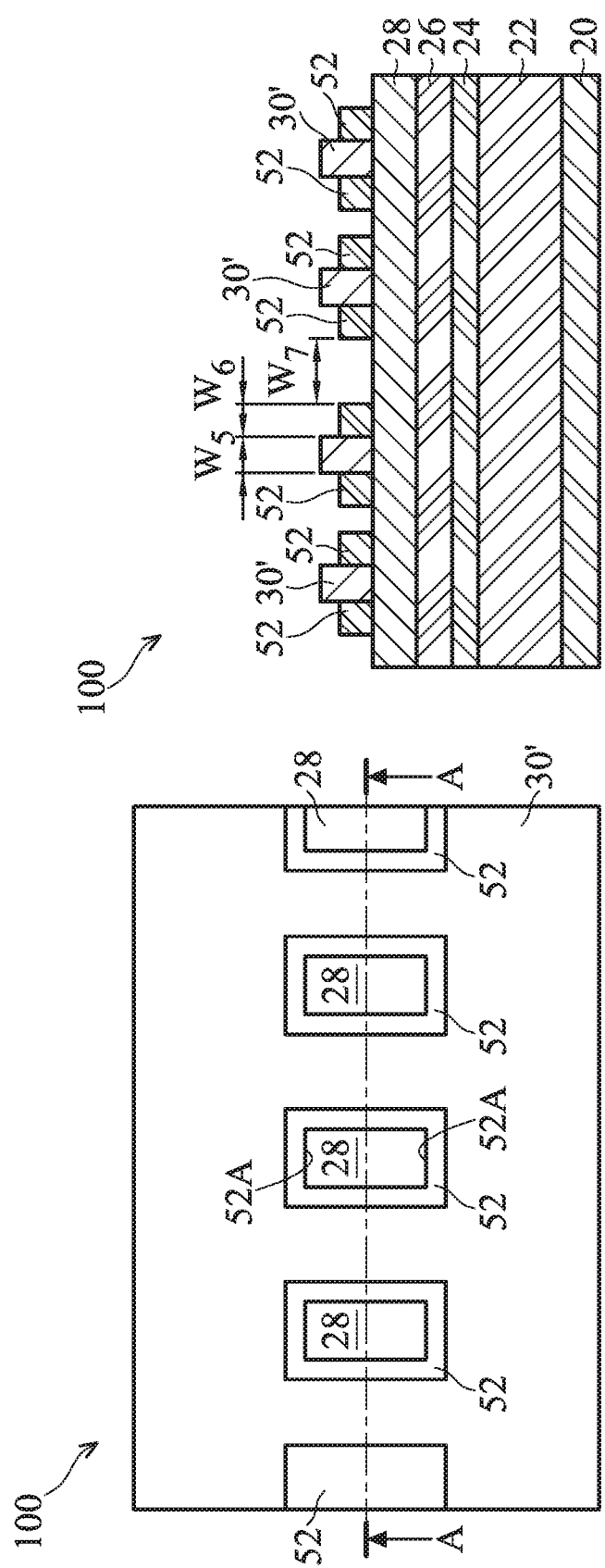
FIGS. 6A-6B illustrate a formation of spacers in accordance with some embodiments.

FIGS. 6A and 6B illustrate the formation of spacers 52 along the sidewalls of the mandrels 30'. After the mandrels 30' are formed, a spacer layer (not shown) is formed over the mandrels 30' and the hard mask layer 28. The spacer layer is similar to the spacer layer described above and the description is not repeated herein, although the spacer layers need not be the same. The thickness of the spacer layer may be selected to determine the thickness of features eventually formed in the semiconductor device layer 22.

After the spacer layer is formed over the mandrels 30', the spacer layer may be etched to expose the mandrels 30' and form spacers 52. The spacer layer may be etched by a similar process to the spacer layer etch described above and the description is not repeated herein, although the spacer layer etch processes need not be the same. In an embodiment, the spacers 52 are formed to have a width $W_6$. In an embodiment, the width $W_6$ is about 1X and the width $W_7$ between adjacent spacers 52 is about 1X. In some embodiments, the widths $W_5$, $W_6$, and $W_7$ are substantially equal.

By forming a second set of spacers 52 on the sidewalls of the pattern of the first set of spacers 42 (used to form mandrels 30'), quadruple patterning is achieved to reduce the pitch while using more proven lithography technology. For example, the current process can use 128 nm pitch lithography and two 16 nm thick spacer layers to achieve a 32 nm pitch interconnect.

Figures 7A, 7B:
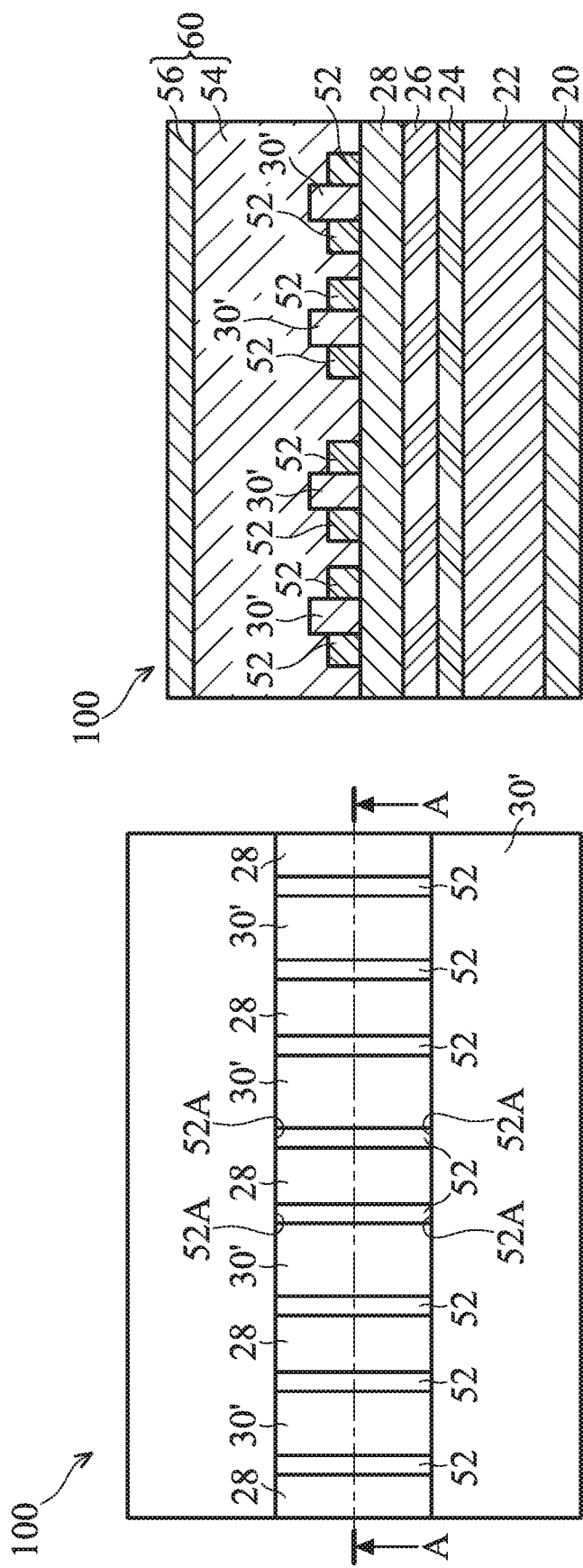
FIGS. 7A-7B illustrate a placement of a photoresist in accordance with some embodiments.

FIGS. 7A and 7B illustrate the formation of a tri-layer photoresist 60 over the spacers 52 and the mandrels 30'. The tri-layer photoresist 60 may be substantially similar to tri-layer photoresist 40 and includes a relatively thin top photoresist layer 58, a middle layer 56 (e.g., a BARC), and a bottom layer 54 (e.g., a hard mask material).

The top photoresist layer 58 may be patterned, for example, by using an immersion photolithography system including a radiation beam which may be a 248 nm beam from a KrF excimer laser or a 193 nm beam from an ArF excimer laser to expose portions of top photoresist layer 58 and develop the exposed/unexposed portions depending on whether a positive/negative photoresist is used. Thus, a pattern such as the pattern illustrated in FIGS. 7A and 7B is formed in the top photoresist layer 58. In an embodiment, the sidewalls of the opening in the top photoresist layer 58 are substantially aligned with sidewalls 52A of the spacers 52 (see FIGS. 6A and 7A). The pattern of the top photoresist layer 58 will be used to mask portions of mandrels 30' so other portions of the mandrels 30' may be removed by a subsequent etching process. The pattern shown in FIGS. 7A and 7B is for illustrative purposes only and different patterns may be formed depending on the design of semiconductor device 100.

FIGS. 8A and 8B illustrate the removal of the portions of the mandrels 30' exposed in the opening of the top photoresist layer 58 (see FIGS. 7A and 7B). The middle layer 56 and the bottom layer 54 of the tri-layer photoresist 60 are patterned by the top photoresist layer 58 such that portions of the top surfaces of the mandrels 30' are exposed. In an embodiment, the exposed mandrels 30' are patterned by a dry etch process with etch process gases including $O_2$, $CO_2$, $C_xH_yF_z$, Ar, $N_2$, $H_2$, the like, a combination thereof, or any other suitable etchant that can remove the mandrels 30' without damaging the spacers 52 and the hard mask layer 28.

In another embodiment, the mandrels 30' may be removed using the semi-aqueous wet etching solution 70 described above with respect to FIG. 5A-5D. In particular, by using the wet etching solution 70, an etching process without oxidants and at a mild pH may be utilized to remove the mandrels 30'. As such, damage to the material of the spacers 52 (e.g., titanium oxide) may be reduced, allowing for a better etching process.

After portions of the mandrels 30' are removed, the spacers 52 remain on a surface of the hard mask layer 28. The spacers 52 each have a width of $W_6$ and they are spaced apart by widths $W_5$ or $W_7$. In an embodiment, the widths $W_5$, $W_6$, and $W_7$ are substantially equal. In an exemplary embodiment, the widths $W_5$, $W_6$, and $W_7$ are all about 16 nm and thus the pitch of the spacers 52 is 32 nm.

As illustrated in FIGS. 8A and 8B, the pattern defined by the spacers 52 and remaining portions of mandrels 30' is a combination of several lithography processes. The line pattern A (LA) results from lithography steps including the tri-layer photoresist 40 and spacers 42 as illustrated in FIGS. 1A through 2B. The line pattern B (LB) results from lithography steps including the tri-layer photoresist 50 and spacers 52 as illustrated in FIGS. 3A through 4B. The line pattern C (LC) results from lithography steps including the tri-layer photoresist 60 and spacers 52 as illustrated in FIGS. 7A through 8B.

Figure 9:
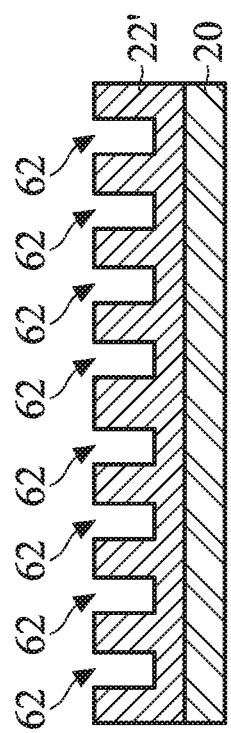
FIG. 9 illustrates a patterning of a dielectric layer in accordance with some embodiments.

As illustrated in FIG. 9, the spacers 52 may be used to pattern the hard mask layer 28, the hard mask layer 26, the ARC layer 24, and the semiconductor device layer 22. In an embodiment, the hard mask layer 28 is patterned by a dry etch process with etch process gases including $O_2$, $CO_2$, $C_xH_yF_z$, Ar, $N_2$, $H_2$, the like, a combination thereof, or any other suitable etchant that can pattern the hard mask layer 28. The patterned hard mask layer 28 is then used as a mask to pattern the hard mask layer 26. In an embodiment, the hard mask layer 26 is patterned using an etch process including etchant gases comprising $Cl_2$, $O_2$, $C_xH_yF_z$, $N_2$, $H_2$, the like, or a combination thereof.

The ARC 24 may be patterned using the patterned hard mask layer 28 as a mask. The ARC 24 may be patterned by an etch process including etchants such as $C_4F_8$, $N_2$, $O_2$, Ar, the like, or a combination thereof. The patterned hard mask layer 28 may be used to transfer the illustrated pattern to the semiconductor device layer 22, for example, through an etching process to form a patterned semiconductor device layer 22'. In an embodiment, an upper portion of the patterned semiconductor device layer 22' has a plurality of trenches 62 formed therein. The spacers 52, the hard mask layer 26, and the ARC layer 24 may then be removed as shown in FIG. 9.

Figure 10:
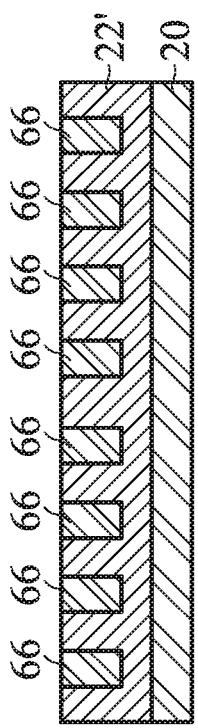
FIG. 10 illustrates a placement of conductive material within the dielectric layer in accordance with some embodiments.

FIG. 10 illustrates forming a conductive material 66 over the patterned semiconductor device layer 22', filling the plurality of trenches 62. The conductive material 66 may include a barrier layer, a seed layer, a liner, or multiple layers or combinations thereof, for example, not shown. A fill material such as copper, a copper alloy, aluminum, an aluminum alloy, the like, or a combination thereof may be formed over the layers/liner using an electro-chemical plating (ECP) method and/or other deposition method. A chemical-mechanical polish (CMP) process and/or etch process may be used to remove excess conductive material 66 from over the top surface of the patterned semiconductor device layer 22', as shown in FIG. 10, forming a plurality of conductive lines 66 in the patterned semiconductor device layer 22'. The conductive lines 66 have substantially the same pitch and spacing as the spacers 52 shown in FIGS. 8A and 8B.

In an embodiment, a method includes exposing a hard mask material to a wet etching solution, the wet etching solution comprising: an etching driving force material which will react with the hard mask material; and a chelator solvent which catalyzes the reaction of the etching driving force material and the hard mask material; and removing at least a portion of the hard mask material with the wet etching solution. In an embodiment the chelator solvent comprises an N-ethanolamide derivative ligand. In an embodiment the chelator solvent comprises 1-(2-hydroxyethyl)-2-pyrrolidinone. In an embodiment the etching driving force material comprises a first fluorine donor material. In an embodiment the etching driving force material comprises a second fluorine donor material different from the first fluorine donor material. In an embodiment the removing the at least the portion of the hard mask material is performed at a pH of between about 5 and about 8. In an embodiment the wet etching solution does not comprise an oxidant.

In another embodiment, a method includes depositing a hard mask material onto a substrate; patterning the hard mask material using a wet etching process, wherein the wet etching process utilizes a semi-aqueous solution, the semi-aqueous solution comprising: at least one fluorine donor material; and a catalyst which allows the fluorine donor material to remove exposed portions of the hard mask material at a pH of between about 5 and about 8. In an embodiment the at least one fluorine donor material comprises at least two fluorine donor materials. In an embodiment the hard mask material is silicon. In an embodiment the semi-aqueous solution is free from oxidants. In an embodiment the catalyst comprises an N-ethanolamide derivative ligand. In an embodiment the catalyst comprises 1-(2-hydroxyethyl)-2-pyrrolidinone. In an embodiment the catalyst comprises N-hydroxyethylphthalimide.

In yet another embodiment, a method includes: providing a first layer of amorphous silicon; and etching the first layer of amorphous silicon using a wet etching process that is free of oxidants, the wet etching process using a wet etchant at a pH of between about 5 and about 8, the wet etchant comprising: a first fluorine donor material; a second fluorine donor material; a solvent which chelates with sites on the first layer of amorphous silicon; and water. In an embodiment the first fluorine donor material is AF, where A represents an ammonia, an amine, or a phosphoric group. In an embodiment the solvent is N,N-diethanololeamide. In an embodiment the solvent is N-hydroxyethylphthalimide. In an embodiment the solvent is 1-(2-hydroxyethyl)pyrrolidine-2,5-dione. In an embodiment the solvent is N-(2-hydroxyethyl)-1,2,3,6-tetrahydrophthalimide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An etchant comprising:
   an etching driving force material; and
   a chelator solvent which catalyzes a reaction of the etching driving force material, wherein the chelator solvent is N-(2-hydroxyethyl)-1,2,3,6-tetrahydrophthalimide.

2. The etchant of claim 1, further comprising a cosolvent, wherein the cosolvent comprises 1-(2-hydroxyethyl)-2-pyrrolidinone.

3. The etchant of claim 1, wherein the etching driving force material comprises a first fluorine donor material.

4. The etchant of claim 3, wherein the first fluorine donor material has a concentration of between about 0.1 wt % and about 10 wt %.

5. The etchant of claim 3, wherein the etching driving force material comprises a second fluorine donor material different from the first fluorine donor material.

6. The etchant of claim 5, wherein the first fluorine donor material has a concentration of between about 0.1 wt % and about 5 wt % and the second fluorine donor material has a concentration of between about 0.1 wt % and about 5 wt %.

7. The etchant of claim 1, wherein the chelator solvent has a concentration of between about 10 wt % and about 70 wt %.

8. An etchant comprising:
   at least one fluorine donor material; and
   a catalyst to the at least one fluorine donor material, the catalyst comprising N-(2-hydroxyethyl)-1,2,3,6-tetrahydrophthalimide, wherein the etchant is at a pH of between about 5 and about 8, and wherein the at least one fluorine donor material and the catalyst are part of a semi-aqueous solution.

9. The etchant of claim 8, wherein the at least one fluorine donor material comprises at least two fluorine donor materials different from each other.

10. The etchant of claim 9, wherein each of the at least two fluorine donor materials has a concentration of between about 0.1 wt % and about 0.2 wt %.

11. The etchant of claim 8, wherein the catalyst further comprises 1-(2-hydroxyethyl)-2-pyrrolidinone.

12. The etchant of claim 8, wherein the semi-aqueous solution is free from oxidants.

13. The etchant of claim 8, further comprising water at a concentration of between about 30 wt % and about 70 wt %.

14. The etchant of claim 8, wherein the catalyst has a concentration of between about 10 wt % and about 40 wt %.

15. An etchant comprising:
   a first fluorine donor material;
   a second fluorine donor material;
   a solvent, wherein the solvent is N,N-diethanololeamide; and
   water, wherein the etchant is free of oxidants and has a pH of between about 5 and about 8.

16. The etchant of claim 15, wherein the first fluorine donor material is AF, where A represents an ammonia, an amine, or a phosphoric group.

17. The etchant of claim 15, further comprising a co-solvent, wherein the co-solvent is N-hydroxyethylphthalimide.

18. The etchant of claim 15, further comprising a co-solvent, wherein the co-solvent is 1-(2-hydroxyethyl)pyrrolidine-2,5-dione.

19. The etchant of claim 15, further comprising a co-solvent, wherein the co-solvent is N-(2-hydroxyethyl)-1,2,3,6-tetrahydrophthalimide.

20. The etchant of claim 15, wherein the solvent has a concentration of between about 10 wt % and about 40 wt %.

* * * * *